(12) United States Patent
Wong et al.

(10) Patent No.: US 6,489,817 B1
(45) Date of Patent: Dec. 3, 2002

(54) CLOCK DIVIDER USING POSITIVE AND NEGATIVE EDGE TRIGGERED STATE MACHINES

(75) Inventors: Choong Kit Wong, Penang (MY); Sammy Cheung, Pleasanton, CA (US); Boon Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/965,290

(22) Filed: Sep. 26, 2001

(51) Int. Cl.[7] ............................................. H03K 21/00
(52) U.S. Cl. ...................................... 327/115; 327/117
(58) Field of Search ........................ 327/113–117, 119, 327/122

(56) References Cited

U.S. PATENT DOCUMENTS

| | | | | |
|---|---|---|---|---|
| 6,121,801 A | * | 9/2000 | Lee ............................ | 327/115 |
| 6,198,317 B1 | * | 3/2001 | Chow et al. ................ | 327/116 |
| 6,271,702 B1 | * | 8/2001 | Stansell ...................... | 327/115 |
| 6,356,123 B1 | * | 3/2002 | Lee et al. ................... | 327/115 |

* cited by examiner

Primary Examiner—Toan Tran
(74) Attorney, Agent, or Firm—Morrison & Foerster LLP (57) ABSTRACT

A clock divider is described. The clock divider includes: a positive edge triggered state machine having a first input for receiving a first input signal and a first output for providing a first output signal; a negative edge triggered state machine having a second input for receiving a second input signal and a second output for providing a second output signal; and a first combination logic coupled to the positive edge triggered state machine and the negative edge triggered state machine, the first combination logic having a third input for receiving third input signals and a third output for providing a third output signal, where (1) at least one of the first input signal and the second input signal includes an input clock signal having an input clock signal period, (2) the third input signals include the first output signal and the second output signal, and (3) the third output includes an output clock signal having an output clock signal period, where the output clock signal period is a multiple of the input clock signal period.

43 Claims, 7 Drawing Sheets

| Fig. 6A | Fig. 6B |

Fig. 6B

CLOCK DIVIDER USING POSITIVE AND NEGATIVE EDGE TRIGGERED STATE MACHINES

BACKGROUND OF THE INVENTION

1. Field of the Invention

This invention relates generally to clock dividers and, in particular, to clock dividers using state machines.

2. Description of the Related Art

It is sometimes desirable to divide a clock signal. In particular, it is at times, desirable to divide a clock signal by a non-integer multiple. For example, it may be desirable to obtain an output clock signal that has a period Tout that is 1.5, 2.5 or some other non-integer multiple of Tin, the period of the input clock signal.

Earlier systems use phase lock loops (PLL) to achieve such non-integer multiples of the input clock signal. Use of PLL's to achieve non-integer clock divide suffers from several disadvantages. First, the PLL circuit occupies a relatively large die area. Second, because PLL involves feedback, it is very sensitive to design parameters. Third, the PLL circuit typically requires a lot of tuning to ensure that it provides the desired non-integer divide. Fourth, the PLL circuit is very difficult to design, in part because it is an active circuit.

As a result, there has been a need for a non-integer clock divider that deals with the above-mentioned shortcomings of the earlier systems.

SUMMARY OF THE INVENTION

A clock divider is described. The clock divider includes: a positive edge triggered state machine having a first input for receiving a first input signal and a first output for providing a first output signal; a negative edge triggered state machine having a second input for receiving a second input signal and a second output for providing a second output signal; and a first combination logic coupled to the positive edge triggered state machine and the negative edge triggered state machine, the first combination logic having a third input for receiving third input signals and a third output for providing a third output signal, where (1) at least one of the first input signal and the second input signal includes an input clock signal having an input clock signal period, (2) the third input signals include the first output signal and the second output signal, and (3) the third output includes an output clock signal having an output clock signal period, where the output clock signal period is a multiple of the input clock signal period.

In one embodiment of the invention, the input to both the negative and positive edge triggered state machines is the input clock signal. Moreover, in one embodiment, the combination logic includes an AND gate.

In one embodiment of the invention, because the positive and negative edge triggered state machines change states only at the positive and negative transitions of the input clock signal, respectively, the positive and negative edge triggered state machines do not change states at the same time. This feature of the invention reduces the likelihood of glitches that result from simultaneous or substanially simultaneous changes in the states of state machines whose outputs are The present invention is explained in more detail below with reference to the drawings.

DETAILED DESCRIPTION OF THE INVENTION

The present invention comprises a clock divider. The following description is presented to enable any person skilled in the art to make and use the invention, and is provided in the context of a particular application and its requirements. Various modifications to the illustrated embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
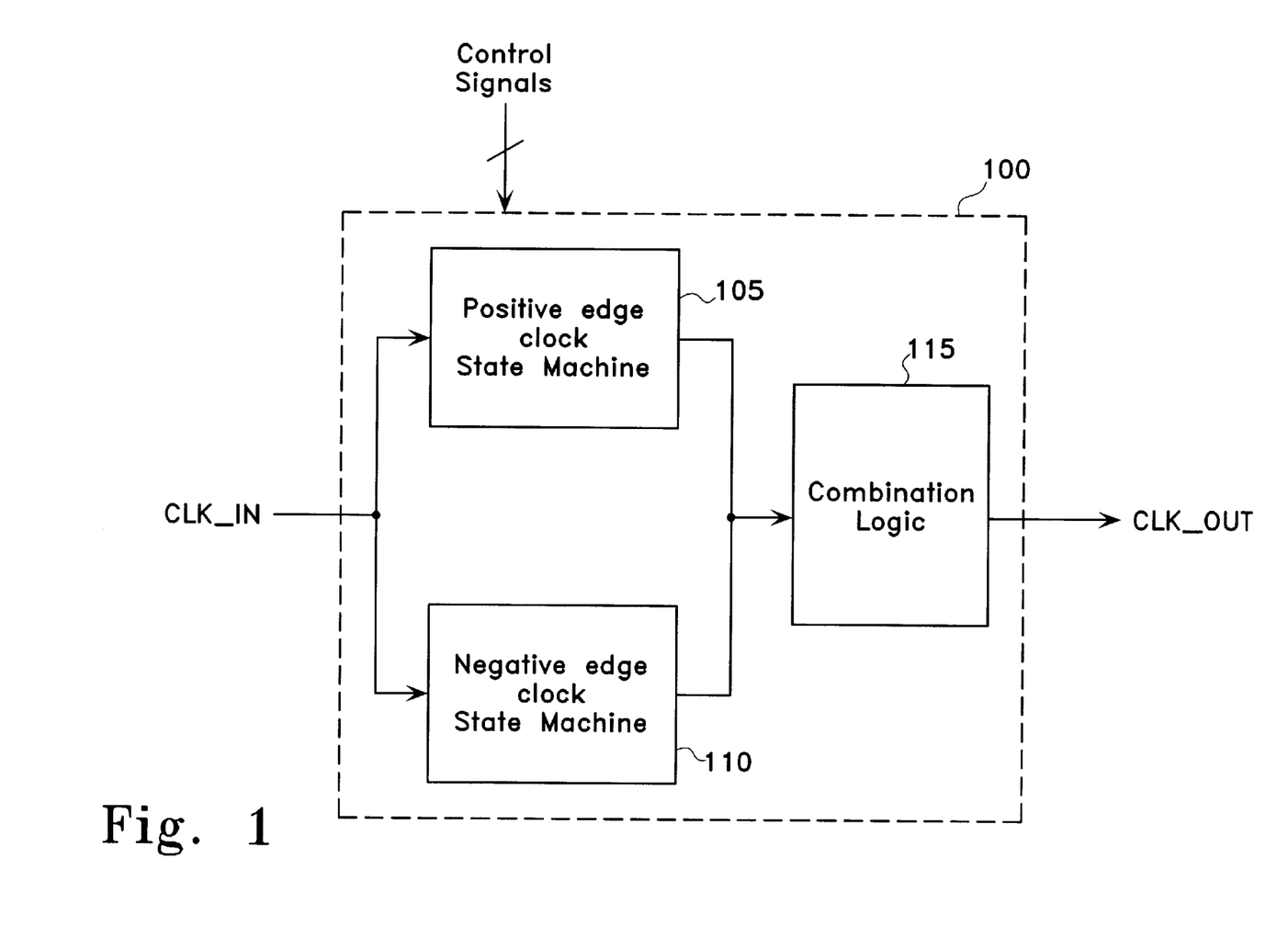
FIG. 1 is a block diagram of an embodiment of a clock divider of the invention.

FIG. 1 is a block diagram of an embodiment of a clock divider of the present invention. In FIG. 1, clock divider 100 includes a positive edge triggered state machine 105, a negative edge triggered state machine 110, and a combination logic 115. Inputs to the clock divider 100 include the clock input signal $CLK_{13}$ IN and control signals. The control signals may include configuration bits, duty cycle control signals, and reset signals. The purpose of the configuration bits is explained below. The reset signal is used to initialize the registers in the clock divider at a predetermined initial state. The output signal includes an output clock signal $CLK_{13}$ OUT. In one embodiment, the output clock signal $CLK_{13}$ OUT has a period Tout that is a non-integer multiple of the period Tin of $CLK_{13}$ IN. In another embodiment, Tout may be an integer multiple of Tin. The duty cycle control signals select the duty cycle of the output clock signal $CLK_{13}$ OUT.

A positive edge triggered state machine, such as the positive edge triggered state machine 105, changes its state at positive transitions of a clock signal. In one embodiment, the positive edge triggered state machine changes its state only at positive transitions of the clock signal. A positive transition is a change or transition from a lower state to a higher state. In one embodiment, in a binary system with a low state (e.g., 0) and a high state (e.g., 1), a positive transition is a transition from the low state (e.g., 0) to the high state (e.g. 1). Similarly, the negative edge triggered state machine 110 changes its state at negative transitions of a clock signal. In one embodiment, the negative edge triggered state machine changes its state only at negative transitions of the clock signal. A negative transition is a change or transition from a higher state to a lower state. In one embodiment, in a binary system with a low state (e.g., 0) and a high state (e.g., 1), a negative transition is a transition from the high state (e.g., 1) to the low state (e.g., 0). The positive and negative transitions may herein also be referred to as positive and negative edges, respectively. In one embodiment, the positive edge triggered state machine 105 and the negative edge triggered state machine 110 change states in response to the input clock signal CLK_IN.

The combination logic 115 combines the output of the positive edge triggered state machine 105 and the negative edge triggered state machine 110 to generate the output clock signal $CLK_{13}$ OUT. In one embodiment, the combination logic 115 performs a Boolean AND function on the outputs of the positive edge triggered state machine 105 and the negative edge triggered state machine 110 to produce the output clock signal $CLK_{13}$ OUT. In one embodiment, the combination logic 115 comprises an AND gate. There are, of course, many other gates or connections that perform the function of the AND gate and those gates or connections may be used in place of the AND gate.

In one embodiment, clock divider 100 may provide different division factors between $CLK_{13}$ OUT and $CLK_{13}$ IN. In other words, clock divider 100 provides for a variable factor X.5 between Tout and Tin, where X is an integer equal to or greater than one. In such an embodiment, the configuration bits select the value of the factor between Tout and Tin. For example, the configuration bit may be selected such that Tout is 1.5 times Tin. In one embodiment (such as that shown in FIG. 6), multiple Tout's are produced and the desired Tout is used. In another embodiment, at any one time, only the desired Tout, as selected by the configuration bits, is produced. Features described above may also be provided when clock divider 100 acts as an integer, rather than a non-integer, clock divider.

Figures 2A, 2B, 2C:
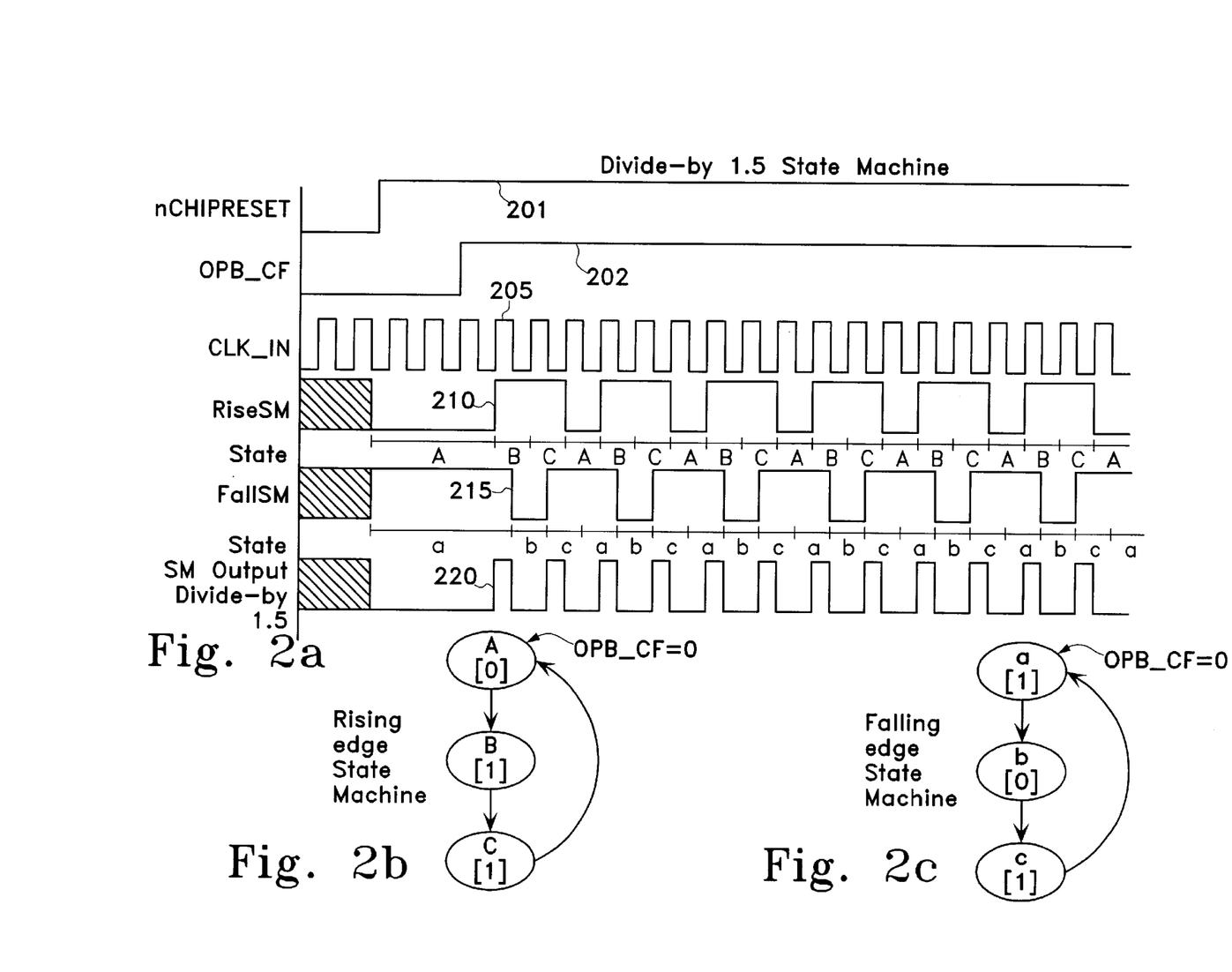
FIG. 2a is a graph of the timing signals of an embodiment of a 1.5 divider of the present invention.
FIG. 2b is a state diagram for an embodiment of a positive edge triggered state machine of the 1.5 divider.
FIG. 2c is a state diagram for an embodiment of a negative edge triggered state machine of the 1.5 divider.

FIG. 2a is a graph of the timing signals of an embodiment of a 1.5 divider of the present invention. In FIG. 2a, graph 205 represents the timing diagram for the input clock $CLK_{13}$ IN. Graph 210 represents the timing diagram for the output signal of the rise state machine (rise SM), which is also herein referred to as the rising edge state machine or positive edge triggered state machine. As can be seen from graph 210, the positive edge triggered state machine changes its state only at the positive transitions of the input clock $CLK_{13}$ IN. Graph 215 represents the timing diagram for the output signal of fall state machine (fall SM), which is also herein referred to as the falling edge state machine or negative edge triggered state machine. As can be seen from graph 210, the negative edge triggered state machine changes its state only at the negative transitions of the input clock $CLK_{13}$ IN. Graph 220 represents the clock output signal $CLK_{13}$ OUT and is the result of performing a Boolean AND operation on graphs 210 and 215. In FIG. 2a, graph 210 is also referenced as SM Output Divide-by 1.5. As can be seen in FIG. 2a, $CLK_{13}$ OUT has a period Tout that is 1.5 times Tin, the period of $CLK_{13}$ IN. Graphs 201 and 202 represent the nCHIPRESET and $OPB_{13}$ CF clock signals, respectively. The nCHIPRESET signal is used to reset the chip of which the non-integer clock divider is a part. The $OPB_{13}$ CF signal is a reset signal for the non-integer clock divider. When $OPB_{13}$ CF is equal to 0, the non-integer clock divider is reset such that the rise and fall SM's are set at their respective initial states. As shown in FIGS. 2a–c, the initial states for the rise and fall SM's are A and a, respectively.

As can also been seen in FIG. 2a, there are three states (A, B, and C) in the rise SM. Similarly, there are three states (a, b, and c) in the fall SM. The number of states in both the rise SM and fall SM are equal to two times 1.5, the divide factor (i.e., the factor between Tout and Tin). As can also be seen in FIG. 2a, each of the states A, B, C, a, b, and c have a duration that is equal to the period of CLK_IN. The value of the states of the rise and fall SM are selected such that their combination produces the desired $CLK_{13}$ OUT. As the timing signals for both the rise and fall SM's are periodic, selecting the value of these signals over a few periods and thereafter repeating them is sufficient for indefinitely generating the desired $CLK_{13}$ OUT.

FIG. 2b is a state diagram for an embodiment of a positive edge triggered state machine of the 1.5 divider. As can be seen in FIG. 2b, the positive edge triggered state machine has three states, A, B, and C. State A is followed by state B, which is in turn followed by state C, which is then followed by state A. The values for states A, B, and C, are 0, 1, and 1, respectively.

FIG. 2c is a state diagram for an embodiment of a negative edge triggered state machine of the 1.5 divider. As can be seen in FIG. 2c, the negative edge triggered state machine has three states, a, b, and c. State a is followed by state b, which is in turn followed by state c, which is then followed by state a. The values for states a, b, and c, are 1, 0, and 1, respectively.

The state transitions in both the rise and fall SM's only occur when $OPB_{13}$ CF is equal to 1. As shown in FIGS. 2b–c, when $OPB_{13}$ CF is equal to 0, then the rise and fall SM's are reset to states A and a, respectively.

Figures 3A, 3B, 3C:
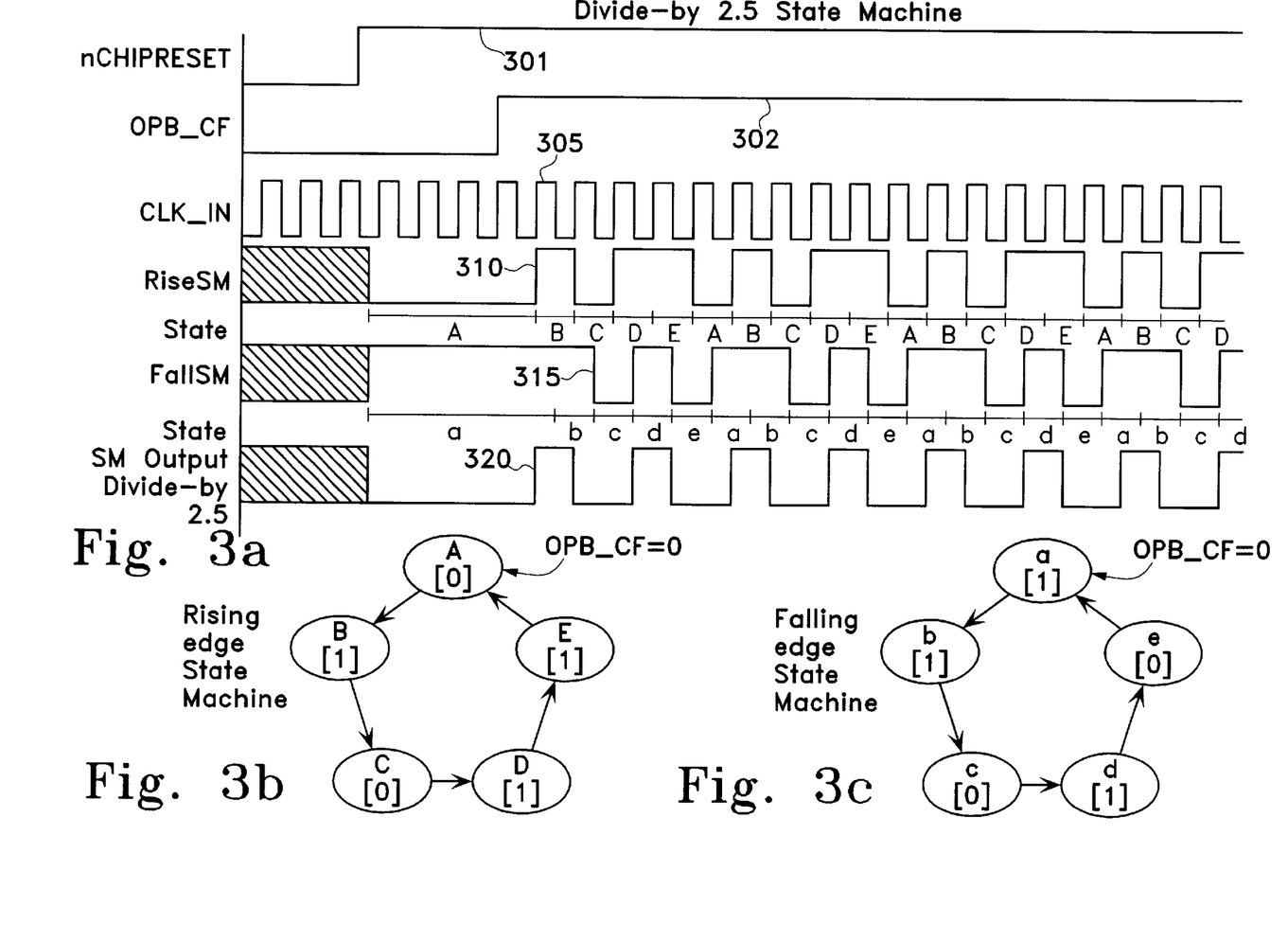
FIG. 3a is a graph of the timing signals of an embodiment of a 2.5 divider of the present invention.
FIG. 3b is a state diagram for an embodiment of a positive edge triggered state machine of the 2.5 divider.
FIG. 3c is a state diagram for an embodiment of a negative edge triggered state machine of the 2.5 divider.

FIG. 3a is a graph of the timing signals of an embodiment of a 2.5 divider of the present invention. In FIG. 3a, graph 305 represents the timing diagram for the input clock $CLK_{13}$ IN. Graph 310 represents the timing diagram for the output signal of the positive edge triggered state machine. As can be seen from graph 310, the positive edge triggered state machine changes its state only at the positive transitions of the input clock $CLK_{13}$ IN. Graph 315 represents the timing diagram for the output signal of the negative edge triggered state machine. As can be seen from graph 310, the negative edge triggered state machine changes its state only at the negative transitions of the input clock $CLK_{13}$ IN. Graph 320 represents the clock output signal $CLK_{13}$ OUT and is the product of Boolean AND-ing graphs 310 and 315. In FIG. 3a, graph 320 is also referenced as SM Output Divide-by 2.5. As can be seen in FIG. 3a, $CLK_{13}$ OUT has a period Tout that is 2.5 times Tin, the period of $CLK_{13}$ IN. Graphs 301 and 302 represent the nCHIPRESET and $OPB_{13}$ CF clock signals, respectively. The nCHIPRESET and $OPB_{13}$ CF clock signals perform functions identical to those performed by their counterparts in FIG. 2a.

As can also been seen in FIG. 3a, there are five states (A, B, C, D, and E) in the rise SM. Similarly, there are five states (a, b, c, d, and e) in the fall SM. The number of states in both the rise SM and fall SM are equal to two times 2.5, the divide factor (i.e., the factor between Tout and Tin). As can also be seen in FIG. 3a, each of the states A, B, C, D, E, a, b, c, d, and e have a period equal to the period of $CLK_{13}$ IN. As in FIG. 2a, the value of the states of the rise and fall SM are selected such that their combination produces the desired $CLK_{13}$ OUT.

FIG. 3b is a state diagram for an embodiment of a positive edge triggered state machine of the 2.5 divider. As can be seen in FIG. 3b, the positive edge triggered state machine has five states, A, B, C, D, and E. When $OPB_{13}$ CF is equal to 1, state A follows state E, and the remaining states follow each other in the order in which they are listed above. The values for states A, B, C, D, and E are 0, 1, 0, 1, and 1, respectively.

FIG. 3c is a state diagram for an embodiment of a negative edge triggered state machine of the 2.5 divider. As can be seen in FIG. 3c, the negative edge triggered state machine has five states, a, b, c, d, and e. When $OPB_{13}$ CF is equal to 1, state a follows state e, and the remaining states follow each other in the order in which they are listed above. The values for states a, b, c, d, and e are 1, 1, 0, 1, and 0, respectively.

The state transitions in both the rise and fall SM's only occur when $OPB_{13}$ CF is equal to 1. As shown in FIGS. 3b–c, when $OPB_{13}$ CF is equal to 0, then the rise and fall SM's are reset to states A and a, respectively.

In FIGS. 2a and 3a, the duty cycle of $CLK_{13}$ OUT is one third, i.e., the period of the high state in each period is one third of Tout, the period of $CLK_{13}$ OUT. In another embodiment, duty cycles other than one third may be provided. As in the case of the one third duty cycle illustrated in FIGS. 2a and 3a, these other duty cycles are produced by properly selecting states of the rise and fall SM's whose combination results in the desired output clock signal. In one embodiment, to produce these other duty cycles, one may need to vary the duration or the number of states in the positive and/or negative edge triggered state machines. Thus, for example, in such an embodiment, states A, B, C, may have periods that are different from the period of the input clock $CLK_{13}$ IN. As another example, in another embodiment, each of the rise and fall SM's in the 1.5 clock divider may have more than three states. In an embodiment with multiple duty cycle options, the duty cycle control signals may be used to select the desired duty cycle.

As can be seen in FIGS. 2a and 3a, the positive and negative edge triggered state machines change states only at the positive and negative transitions of the input clock signal, respectively. Thus, the positive and negative edge triggered state machines do not change states at the same time. This feature of the invention reduces the likelihood of glitches due to simultaneous or substantially simultaneous changes in the states of the positive and negative edge triggered state machines.

The positive transitions and the negative transitions constitute two mutually exclusive sets. In other words, the set of positive transitions does not include any negative transitions, and similarly, the set of negative transitions does not include any positive transitions. Other sets of mutually exclusive transitions (besides positive and negative transitions) may also provide the advantage of avoiding glitches.

The state diagrams for the rising and falling edge state machines are used to create the state machines. Conventional methods, as well as methods that may be developed in the future, may be used to design a state machine that implements a state diagram. In one embodiment, a register transfer language (RTL) code is used to generate the necessary register based circuit that implements the desired state diagram.

Figure 4:
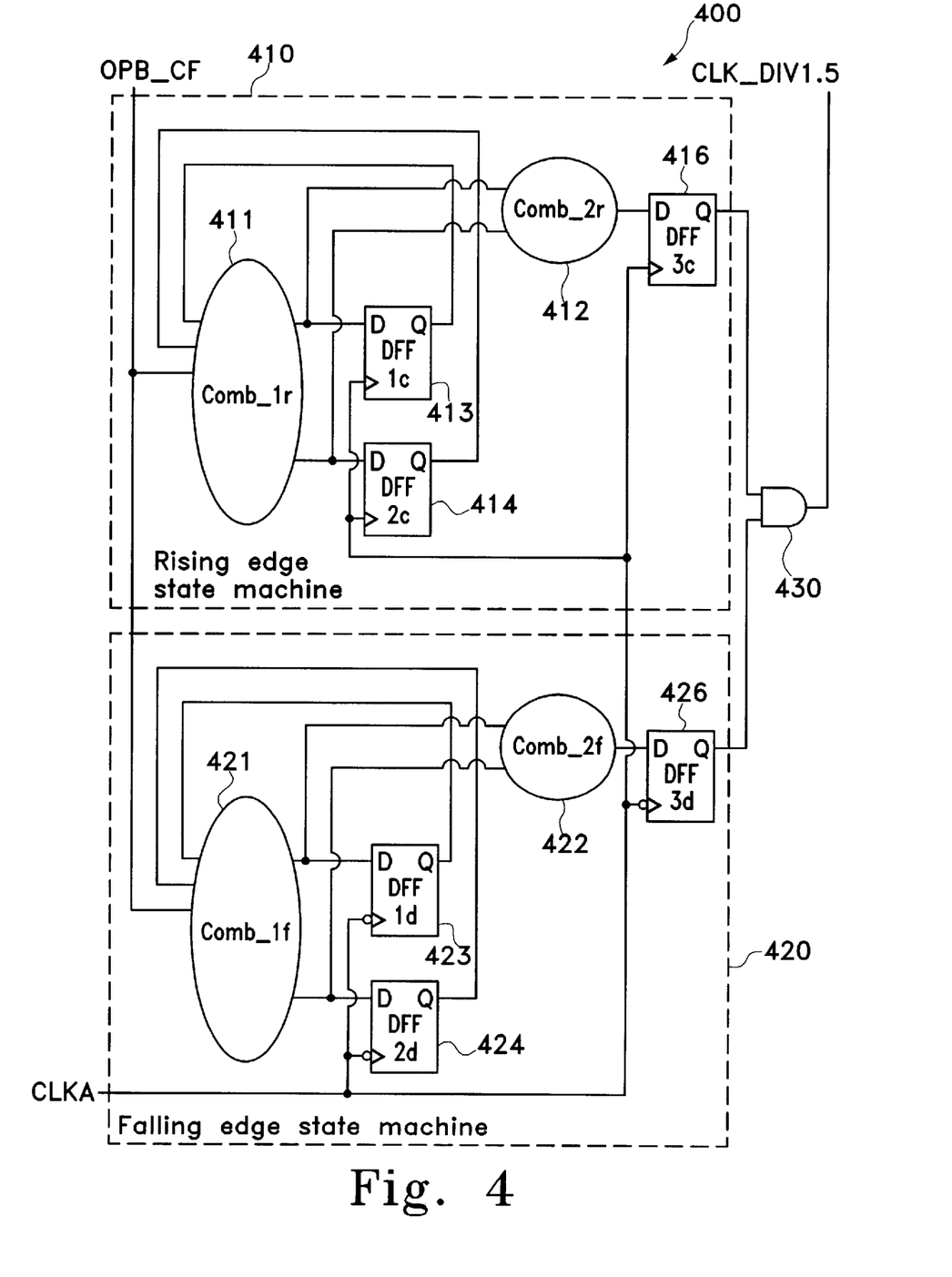
FIG. 4 is a block diagram of one embodiment of the 1.5 divider of the present invention.

FIG. 4 is a block diagram of one embodiment of the 1.5 divider of the present invention. This block diagram represents a general level diagram of the state machine circuit created using the state diagrams shown in FIGS. 2b–c. In FIG. 4, non-integer clock divider 400 includes a rising edge state machine 410, a falling edge state machine 420, and a combination logic 430.

Rising edge state machine 410 includes combination logic elements 411 and 412 and registers 413, 414 and 416. In the embodiment shown in FIG. 4, registers 413, 414, and 416 are D flip flops. Combination logic 411 is coupled to the $OPB_{13}$ CF signal (i.e., the reset signal for the non-integer clock divider 400) and registers 413 and 414. The combination logic 411 receives the current state from the registers 413 and 414. Thereafter, combination logic 411 generates the next state. In one embodiment, combination logic 411 includes registers for generating the next state. The next state values are provided to the registers 413 and 414 and combination logic 412. Registers 413 and 414 which are positive edge triggered flip flops pass the next state value at a positive transition of the input clock signal CLKA. Combination logic element 412 decodes the next state and presents the value of the next state to register 416. As a positive edge triggered flip flop, register 416 passes the value of next state to the combination logic 430 at a positive transition of the input clock CLKA.

Falling edge state machine 420 includes combination logic elements 421 and 422 and registers 423, 424 and 426. In the embodiment shown in FIG. 4, registers 423, 424, and 426 are negative edge triggered D flip flops. Combination logic 421 is coupled to the OPB_CF signal and registers 423 and 424. The combination logic receives the current state from the registers 423 and 424. Thereafter, combination logic 421 generates the next state. In one embodiment, combination logic 421 includes registers for generating the next state. The next state values are provided to the registers 423 and 424 and combination logic 422. Registers 423 and 424 which are negative edge triggered flip flops pass the next state value at the negative transition of the clock signal CLKA. Combination logic element 422 decodes the next state and presents the value of the next state to register 426. As a negative edge triggered flip flop, register 426 passes the value of the next state to the combination logic 430 at a negative transition of the input clock CLKA.

As can be seen in FIG. 4, combination logic 430 is an AND gate. It, therefore, performs a Boolean AND operation on the outputs of the positive and negative edge triggered state machines 410 and 420. The output of the combination logic 430 is the output clock signal $CLK_{13}$ DIV 1.5, which has a period that is 1.5 times the period of the input clock signal CLKA.

Figure 5:
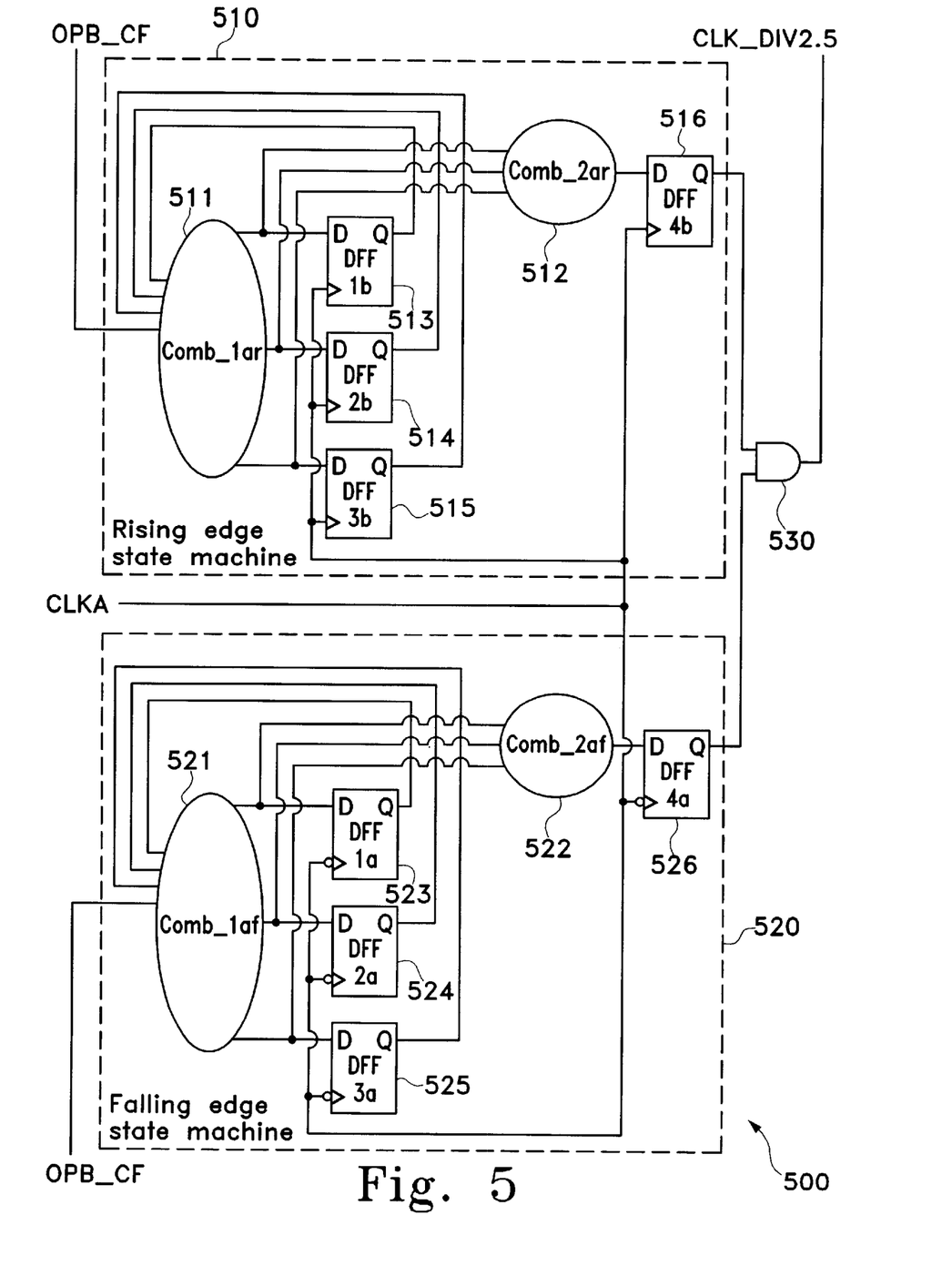
FIG. 5 is a block diagram of one embodiment of the 2.5 divider of the present invention.

FIG. 5 is a block diagram of one embodiment of the 2.5 divider of the present invention. This block diagram represents a general level diagram of the state machine circuit created using the state diagrams shown in FIGS. 3b–c. In FIG. 5, non-integer clock divider 500 includes a rising edge state machine 510, a falling edge state machine 520, and a combination logic 530. Non-integer clock divider 500 is similar to non-integer clock divider 400. The main difference between the two is that non-integer clock divider 500 includes three, rather than two, registers for transmitting the next state. Thus, non-integer clock divider 500 includes registers 515 and 525 which have no counterparts in non-integer clock divider 400 (shown in FIG. 4). The additional registers 515 and 525 in non-integer clock divider 500 are used to uniquely define the additional states in non-integer clock divider 500 that do not exist in non-integer clock divider 400. The elements of FIG. 5 that have functions similar to their counterparts in FIG. 4 have been numbered with reference numbers that differ from their counterparts in FIG. 4 by one hundred. For example, rising edge state machine 510 in FIG. 5 corresponds to rising edge state machine 410 in FIG. 4. The elements of FIG. 5 have functions similar to their counterparts in FIG. 4. As suggested by its name, the output clock signal $CLK_{13}$ DIV2.5 of the non-integer clock divider 500 has a period that is 2.5 times the period of input clock signal CLKA.

Figures 6, 6A:
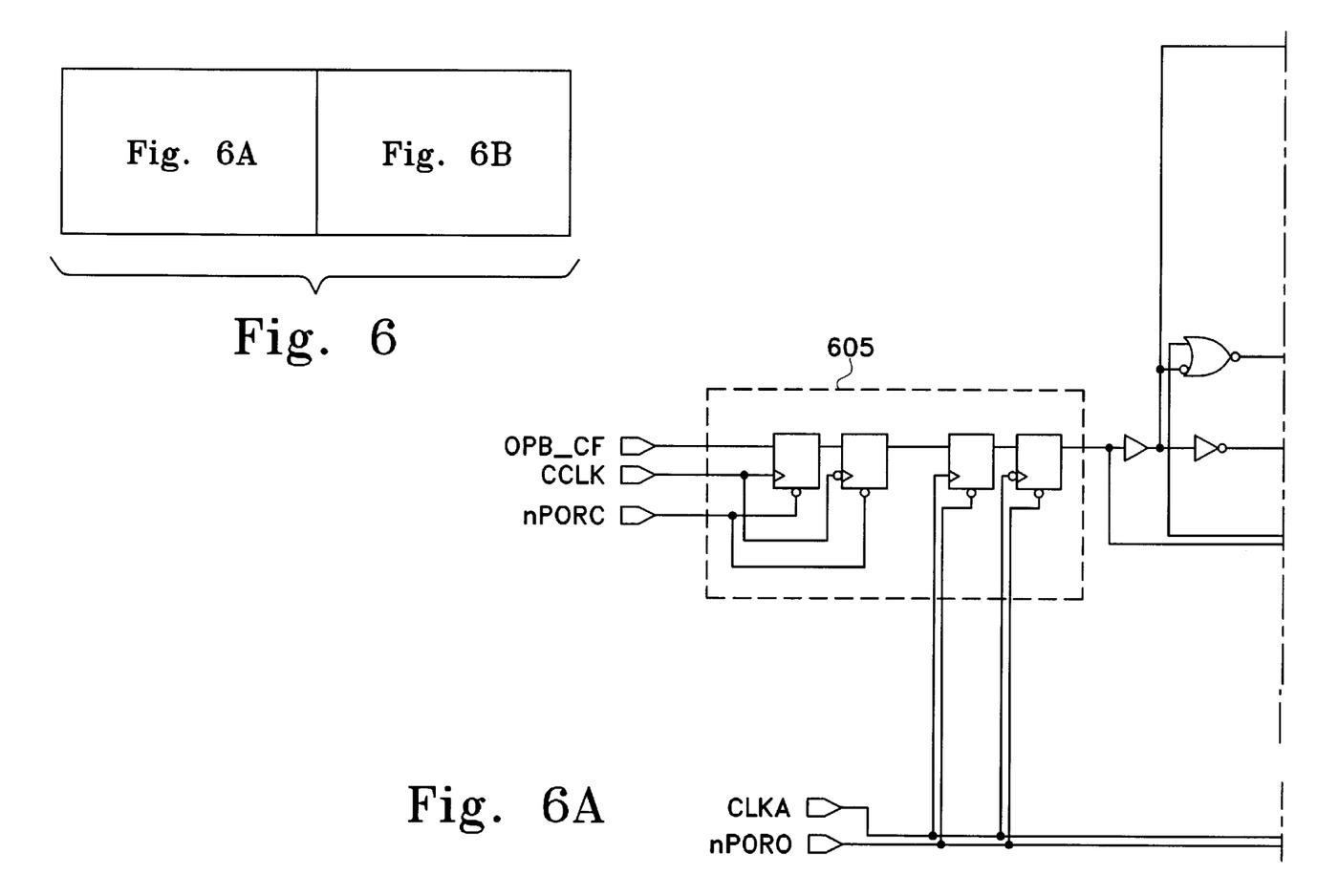
FIG. 6 is circuit diagram of an embodiment of the clock divider of the present invention including a 1.5 and 2.5 dividers.
Figure 6B:
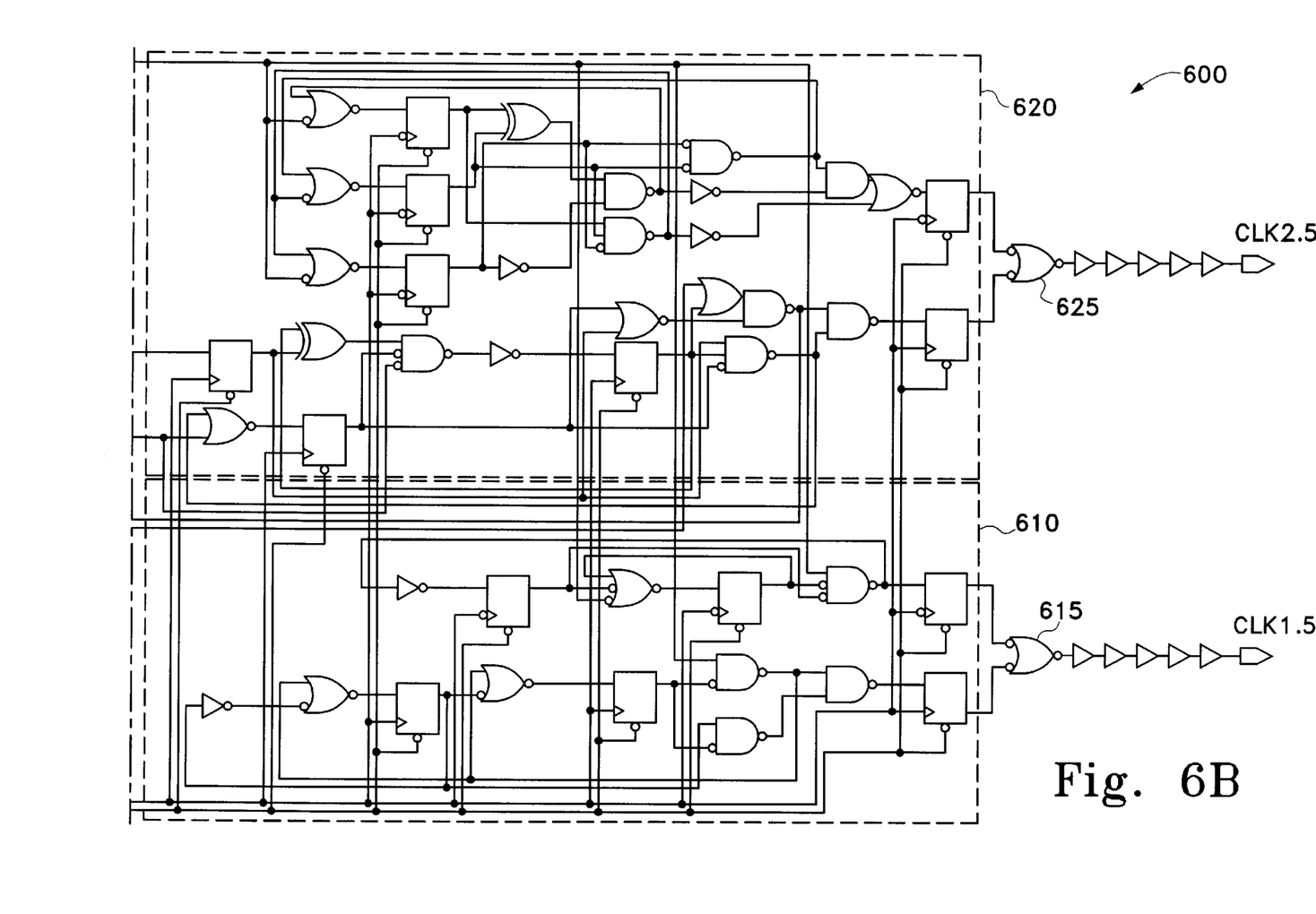

FIG. 6 is circuit diagram of an embodiment of the clock divider of the present invention including 1.5 and 2.5 dividers. In FIG. 6, non-integer clock divider 600 includes a synchronization circuit 605, a 1.5 divide state machines 610, a 1.5 combination logic 615, a 2.5 divide state machines 620, and a 2.5 combination logic 625.

The synchronization circuit 605 synchronizes the non-integer clock divider 600 with other blocks with which it interfaces. Inputs to the synchronization circuit 605 include $OPB_{13}$ CF, CCLK, nPORC, CLKA, and nPORO. As explained above, $OPB_{13}$ CF is the reset signal for the non-integer clock divider. As also explained above, CLKA is the input clock signal to the non-integer clock divider. CCLK is the system clock signal for the system of which the non-integer clock divider 600 is a part or with which the non-integer clock divider 600 interfaces. nPORC is the power on reset signal for the system. nPORO is the power on reset signal for the non-integer clock divider 600. In synchronization circuit 605, $OPB_{13}$ CF is synchronized with CCLK.

The 1.5 state machines 610 includes the 1.5 divide positive and negative edge triggered state machines. The outputs of the 1.5 positive and negative edge triggered state machines are input into combination logic 615. Combination logic 615 performs a Boolean AND operation on the outputs of the 1.5 positive and negative edge triggered state machines. The output of combination logic 615 is amplified and output-as the CLK1.5 signal. The CLK1.5 signal has a period that is 1.5 times the period of CLKA.

Similarly, the 2.5 state machines 620 includes the 2.5 divide positive and negative edge triggered state machines. The outputs of the 2.5 positive and negative edge triggered state machines are input into combination logic 625. Combination logic 625 performs a Boolean AND operation on the outputs of the 2.5 positive and negative edge triggered state machines. The output of combination logic 625 is amplified and output as the CLK2.5 signal. The CLK2.5 signal has a period that is 2.5 times the period of CLKA.

Non-integer clock divider 600 outputs both a 1.5 output and a 2.5 output. The user has the option of using one or both of the 1.5 and 2.5 outputs.

Non-integer clock divider 600 is generated in response to RTL code representing the desired state diagrams, such as those shown in FIGS. 2b–c and 3b–c. It will be appreciated by those skilled in the art that many variants on the non-integer clock divider 600 that implement the desired state diagrams may be generated by making different design choices, such as choosing different initialization parameters, in preparing the RTL code. Thus, the specific circuit shown in FIG. 6 is only one example of the many circuits that are within the scope of the present invention.

In another embodiment, the state machine that may be configured to produce an X.5 divide for any X greater than or equal to one. Thus, instead of having separate state machines for the 1.5 and 2.5 divide, there would be one state machine that may be configured using the proper configuration bits to generate the desired (or selected) X.5 divide. Also, although the present invention has been described in relation to X.5 non-integer dividers, it is not limited to X.5 dividers, since it applies to other non-integer dividers (e.g., X.4, X.6, etc.). Similarly, the present invention is not limited to non-integer dividers, since it encompasses integer dividers.

The clock divider of the present invention may be used in many systems in which it is desired to divide an input clock by an integer or a non-integer factor. For example, the clock divider may be used in a digital system. More specifically, the clock divider may be used in a digital system comprising a programmable logic device (PLD). Additionally, the clock divider may be used in a PLD. As used herein a digital system is not intended to be limited to a purely digital system, but also encompasses hybrid systems that include both digital and analog subsystems. Thus, the present invention encompasses digital systems that include the clock divider described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A clock divider comprising:

a positive edge triggered state machine having a first input for receiving a first input signal and a first output for providing a first output signal;

a negative edge triggered state machine having a second input for receiving a second input signal and a second output for providing a second output signal; and a first combination logic coupled to the positive edge triggered state machine and the negative edge triggered state machine, the first combination logic having a third input for receiving third input signals and a third output for providing a third output signal, wherein at least one of the first input signal and the second input signal comprises an input clock signal having an input clock signal period, further wherein the third input signals comprise the first output signal and the second output signal, and further wherein the third output signal comprises an output clock signal having an output clock signal period, wherein the output clock signal period is a multiple of the input clock signal period;

further wherein at least one of the positive edge triggered state machine and the negative edge triggered state machine comprises a state machine combination logic to determine a next state based on a current state and the input clock signal.

2. The clock divider of claim 1, wherein the output clock signal period is a non-integer multiple of the input clock signal period.

3. The clock divider of claim 1, wherein the first combination logic comprises an AND gate.

4. The clock divider of claim 1, wherein the positive edge triggered state machine comprises the state machine combination logic, wherein the state machine combination logic comprises a second combination logic to determine the next state based on the current state and the input clock signal, further wherein the positive edge triggered state machine comprises:

a third combination logic that decodes the next state signal and produces a state signal;

a plurality of registers coupled to the second combination logic, wherein the plurality of registers transmit the next state signal at a first positive clock edge; and an additional register coupled to the third combination logic to transmit the state signal to the first combination logic at a second positive clock edge.

5. The clock divider of claim 1, wherein the negative edge triggered state machine comprises the state machine combination logic, wherein the state machine combination logic comprises a fourth combination logic to determine the next state based on the current state and the input clock signal, further wherein the negative edge triggered state machine comprises:
- a fifth combination logic that decodes the next state signal and produces a state signal;
- a plurality of registers coupled to the fourth combination logic, wherein the plurality of registers transmit the next state signal at a first negative clock edge; and
- an additional register coupled to the fifth combination logic to transmit the state signal to the first combination logic at a second negative clock edge.

6. The clock divider of claim 1, wherein the output clock signal period is equal to X.5 times the input clock signal period, wherein X is an integer equal to or greater than 1.

7. The clock divider of claim 6, wherein X.5 is 1.5.

8. The clock divider of claim 6, wherein X.5 is 2.5.

9. A digital system including a programmable logic device and the clock divider of claim 1.

10. A programmable logic device including the clock divider of claim 1.

11. The clock divider of claim 1, wherein the positive and negative edge triggered state machines change states only at positive and negative transitions of the input clock signal, respectively, and the positive and negative edge triggered state machines do not change states at the same time.

12. The clock divider of claim 1, wherein the clock divider is programmable to provide one of a plurality of divide factors between the output clock signal period and the input clock signal period.

13. The clock divider of claim 1, wherein the first combination logic provides a plurality of third output signals, wherein the plurality of third output signals comprises a plurality of output clock signals having a plurality of output clock signal periods.

14. A clock divider comprising:
- a first state machine, the first state machine receiving an input clock signal and producing a first output signal, wherein the first output signal changes its state at a first set of transitions of the input clock signal;
- a second state machine, the second state machine receiving the input clock signal and producing a second output signal, wherein the second output signal changes its state at a second set of transitions of the input clock signal, further wherein the first and second sets of transitions are mutually exclusive sets; and
- a first combination logic coupled to the first and second state machines, the combination logic using the first and second output signals to produce an output clock signal, wherein the input clock signal has an input clock signal period and the output clock signal has an output clock signal period, further wherein the output clock signal period is a multiple of the input clock signal period;
- wherein the first state machine comprises a second combination logic to determine a first next state based on a current state and the input clock signal.

15. The clock divider of claim 14, wherein the output clock signal period is an non-integer multiple of the input clock signal period.

16. The clock divider of claim 14, wherein the first set of transitions are positive transitions of the input clock signal and the second set of transitions are negative transitions of the input clock signal.

17. The clock divider of claim 14, wherein states of the first output signal and the second output signal include a high state and a low state.

18. The clock divider of claim 14, wherein the first combination logic performs a Boolean AND operation on the first and second outputs to produce the output clock signal.

19. The clock divider of claim 14, wherein the first state machine further comprises:
- a third combination logic that decodes the first next state signal and produces a state signal;
- a plurality of registers coupled to the second combination logic, wherein the plurality of registers transmit the first next state signal at a first positive transition of the input clock signal; and
- an additional register coupled to the third combination logic to transmit the state signal to the first combination logic at a second positive transition of the input clock signal.

20. The clock divider of claim 19, wherein the second state machine comprises:
- a fourth combination logic to determine a second next state based on a current state and the input clock signal;
- a fifth combination logic that decodes the second next state signal and produces a state signal;
- a plurality of registers coupled to the fourth combination logic, wherein the plurality of registers transmit the second next state signal at a first negative transition of the input clock signal; and
- an additional register coupled to the fifth combination logic to transmit the state signal to the first combination logic at a second negative transition of the input clock signal.

21. The clock divider of claim 14, wherein the output clock signal period is equal to X.5 times the input clock signal period, wherein X is an integer equal to or greater than 1.

22. The clock divider of claim 21, wherein X.5 is 1.5.

23. The clock divider of claim 21, wherein X.5 is 2.5.

24. A digital system including a programmable logic device and the clock divider of claim 14.

25. A programmable logic device including the clock divider of claim 14.

26. The clock divider of claim 14, wherein the clock divider is programmable to provide one of a plurality of divide factors between the output clock signal period and the input clock signal period.

27. The clock divider of claim 14, wherein the first combination logic provides a plurality of output clock signals having a plurality of output clock signal periods.

28. A method of producing a clock signal, the method comprising:
- using a positive edge triggered state machine to generate a first output signal in response to a first input signal;
- using a negative edge triggered state machine to generate a second output signal in response to a second input signal; and
- performing a Boolean AND operation on the first and second output signals to produce an output clock signal,
- wherein at least one of the first input signal and the second input signal is an input clock signal having an input clock signal period, further wherein the output clock signal has an output clock signal period, and further wherein the output clock signal period is a multiple of the input clock signal period.

29. The method of claim 28, wherein the output clock signal period is a non-integer multiple of the input clock signal period.

30. The method of claim 28, wherein each of said first and second input signals comprises the first input clock signal.

31. The method of claim 28, wherein said using the positive edge triggered state machine comprises:

determining a first next state based on a first current state and the first input signal;

decoding the first next state to produce a first state signal;

transmitting the first state signal at a first positive transition of the first input signal; and transmitting the first state signal at a second positive transition of the first input signal.

32. The method of claim 31, wherein said using the negative edge triggered state machine comprises:

determining a second state based on a second current state and the second input signal;

decoding the second next state to produce a second state signal;

transmitting the second state signal at a first negative transition of the second input signal; and transmitting the second state signal at a second negative transition of the second input signal.

33. The method of claim 28, wherein the output clock signal period is equal to X.5 times the input clock signal period, wherein X is an integer equal to or greater than 1.

34. The method of claim 33, wherein X.5 is 1.5.

35. The method of claim 33, wherein X.5 is 2.5.

36. The method of claim 28, further comprising programming the positive and negative edge triggered state machines to provide one of a plurality of divide factors between the output clock signal period and the input clock signal period.

37. The method of claim 28, further comprising performing a plurality of Boolean AND operations on a plurality of first and second output signals to produce a plurality of output clock signals having a plurality of output clock signal periods.

38. The clock divider of claim 1, wherein the input clock signal has an input clock signal duty cycle, further wherein the output clock signal has an output clock signal duty cycle, wherein the output clock signal duty cycle is different from the input clock signal duty cycle.

39. The clock divider of claim 38, wherein the output clock signal duty cycle is one third.

40. The clock divider of claim 14, wherein input clock signal has an input clock signal duty cycle, further wherein the output clock signal has an output clock signal duty cycle, wherein the output clock signal duty cycle is different from the input clock signal duty cycle.

41. The clock divider of claim 40, wherein the output clock signal duty cycle is one third.

42. The method of claim 28, wherein the input clock signal has an input clock signal duty cycle, further wherein the output clock signal has an output clock signal duty cycle, wherein the output clock signal duty cycle is different from the input clock signal duty cycle.

43. The method of claim 42, wherein the output clock signal duty cycle is one third.

* * * * *